US012744404B2

(12) United States Patent
Limoge et al.

(10) Patent No.: US 12,744,404 B2
(45) Date of Patent: Sep. 22, 2026

(54) LOAD SHARING TECHNIQUES FOR ELECTRIC POWER SOURCES

(71) Applicant: Caterpillar Inc., Peoria, IL (US)

(72) Inventors: Philip L. Limoge, Bridport, VT (US); Matthew L. Andrews, Woodstock, GA (US); Edward M. Schroeder, Germantown Hills, IL (US)

(73) Assignee: Caterpillar Inc., Peoria, IL (US)

(*) Notice: Subject to any disclaimer, the term of this patent is extended or adjusted under 35 U.S.C. 154(b) by 415 days.

(21) Appl. No.: 18/229,490

(22) Filed: Aug. 2, 2023

(65) Prior Publication Data

US 2025/0047132 A1 Feb. 6, 2025

(51) Int. Cl.

*H02J 13/12* (2026.01)
*H03H 17/02* (2006.01)

(52) U.S. Cl.

CPC ............ *H02J 13/12* (2026.01); *H03H 17/02* (2013.01)

(58) Field of Classification Search

CPC ...... H02J 13/00002; H02J 3/388; H02J 3/381; H03H 17/02

See application file for complete search history.

(56) References Cited

U.S. PATENT DOCUMENTS 9,590,550 B2 3/2017 Desabhatla et al.
9,660,455 B2 5/2017 Votoupal et al.
9,709,964 B2 7/2017 Schultz
9,806,530 B2 10/2017 Martinez
9,898,062 B2 2/2018 Shah et al.
9,899,842 B2 2/2018 Shiota et al.
9,912,158 B2 3/2018 Ravikumar et al.
11,131,969 B2 9/2021 Salsbury et al.
2011/0190957 A1* 8/2011 Iwagami .................. G06F 1/28 700/293
2013/0051103 A1* 2/2013 Roscoe ............ H02M 7/53875 363/131
2013/0181530 A1* 7/2013 Deboy .................... H02J 3/381 307/82
2014/0191582 A1* 7/2014 Deboy .................... H02M 7/48 307/82
2014/0307488 A1* 10/2014 Brogan .................... H02P 9/02 363/35
2015/0295581 A1* 10/2015 Shi ........................... H02J 3/40 700/287
2021/0265906 A1* 8/2021 Summanen ............. H02M 1/00
2021/0309392 A1* 10/2021 Wiegman ........... B64C 29/0025
2023/0318306 A1* 10/2023 Elfouly .................. H02J 3/381 700/286

OTHER PUBLICATIONS

Written Opinion and International Search Report for Int'l. Patent Appln. No. PCT/US2024/037972, mailed Oct. 29, 2024 (13 pgs).

* cited by examiner

*Primary Examiner* — Ziaul Karim

(57) ABSTRACT

Techniques are described that not only weigh frequency/voltage and real/reactive load sharing separately, but also utilize a window around a setpoint, such as a percentage of an output range, and determine whether there is oscillation. In response, a control system can adjust a time-independent component of a closed-loop controller to weaken the time-independent component to try and reduce the oscillation. The control system can continue to monitor and weaken the time-independent component until it reaches some limit or until it comes back into control.

18 Claims, 4 Drawing Sheets

LOAD SHARING TECHNIQUES FOR ELECTRIC POWER SOURCES

TECHNICAL FIELD

This document relates generally to power generating systems and, in particular, to adaptive control of power generating systems.

BACKGROUND

Typically, a generator set, or genset, can be used as a primary, off-grid power source or as a backup power source to an existing electrical grid system. For example, gensets may be used to provide electrical power at construction sites where utility electricity may be unavailable. A genset is a combination of an electrical generator and an engine. The engine, or other prime mover, may combust fuel to provide mechanical power to the electrical generator. The electrical generator converts the mechanical power received from the engine into electrical power.

U.S. Pat. No. 9,590,550 discloses a system including an excitation system. The excitation system includes a memory configured to store an adaptive power system stabilizer (PSS) system configured to dynamically stabilize the operation of a generator system, and a processor communicatively coupled to the memory and configured to utilize the adaptive PSS system according to a value for one or more operational parameters of the generator system. The derived value is applied by the processor to operate the generator system when the generator system exhibits oscillations at least one of a plurality of operating frequency ranges associated with an oscillation of a power angle of the generator system. The derived value is configured to attenuate the oscillation of the power angle over the at least one of the plurality of interval operating frequency ranges.

SUMMARY

This disclosure describes techniques that not only weigh frequency/voltage and real/reactive load sharing separately, but also utilize a window around a setpoint, such as a percentage of an output range, and determine whether there is oscillation. In response, a control system can adjust a time-independent component of a closed-loop controller to weaken the time-independent component to try and reduce the oscillation. The control system can continue to monitor and weaken the time-independent component until it reaches some limit or until it comes back into control.

In an aspect, this disclosure is directed to a control system to monitor and control a first electric power source coupled in parallel with a second electric power source, wherein the first electric power source and the second electric power source are configured to share a load, the control system comprising: a processor configured to: receive a representation of a first measurement and a representation of a second measurement; generate corresponding error values for the first measurement and the second measurement and combine the corresponding error values as a single first error value; compare the single first error value to a first window, wherein the first window defines upper and lower limits about a first characteristic of the first electric power source, wherein the first window is configured to generate a first output signal representing an adjustment to a time-independent component of a closed-loop controller; and generate, using the first output signal and the closed-loop controller having a time-dependent component and the time-independent component, a first control signal; and a controller coupled to the first electric power source and configured to receive the first control signal and, in response, adjust the first characteristic of the first electric power source.

In another aspect, this disclosure is directed to a computer-implemented method of monitoring and controlling a first electric power source coupled in parallel with a second electric power source, wherein the first electric power source and the second electric power source are configured to share a load, the computer-implemented method comprising: receiving a representation of a first measurement and a representation of a second measurement; generating corresponding error values for the first measurement and the second measurement and combining the corresponding error values as a single first error value; comparing the single first error value to a first window, wherein the first window defines upper and lower limits about a first characteristic of the first electric power source; generating a first output signal representing an adjustment to a time-independent component of a closed-loop controller; generating, using the first output signal and the closed-loop controller having a time-dependent component and the time-independent component, a first control signal; and adjusting, based on the first control signal, the first characteristic of the first electric power source.

In yet another aspect, this disclosure is directed to a control system to monitor and control a first electric power source coupled in parallel with a second electric power source, wherein the first electric power source and the second electric power source are configured to share a load, the control system comprising: a processor configured to; receive a representation of a first measurement and a representation of a second measurement; generate corresponding error values for the first measurement and the second measurement and combine the corresponding error values as a single first error value; compare the single first error value to a proportional component window, wherein the proportional component window defines upper and lower limits about a first characteristic of the first electric power source, wherein the proportional component window is configured to generate a first output signal representing an adjustment to a proportional component of a closed-loop controller; and generate, using the first output signal and a controller having the proportional component and an integral component, a first control signal; and a controller coupled to the first electric power source and configured to receive the first control signal and, in response, adjust the first characteristic of the first electric power source.

DETAILED DESCRIPTION

A control algorithm used to govern electrical power sources, e.g., generator sets, electric utility sources, and the like, so that one or more electrical power sources of varying size and type may operate in parallel to power a wide variety of changing loads with or without the presence of a stable power source. The control algorithm controls the performance of the load sharing between multiple electric power sources, e.g., generator sets or gensets. Changes in the real and reactive loads of a system can also influence voltage and frequency control of the same system, along with issues due to integrator wind-up and proportional oscillation.

A conventional approach is to split the problem into two separate control schemes, one that controls engine speed via a signal to the engine electronic control module (ECM) or controller, and one that controls a genset voltage via a signal to the genset voltage regulator. The conventional control system for speed and voltage is a closed-loop design that monitors both frequency/voltage and real/reactive power. The balance between frequency/voltage control and real/reactive control is made by defining a weight factor that determines a fixed ratio from 100% real/reactive power to 100% frequency/voltage or a fixed or sliding value between the two.

This disclosure describes techniques that not only weigh frequency/voltage and real/reactive load sharing separately, but also utilize a window around a setpoint, such as a percentage of an output range, and determine whether there is oscillation. In response, a control system can adjust a time-independent component of a closed-loop controller to weaken the time-independent component to try and reduce the oscillation. The control system can continue to monitor and weaken the time-independent component until it reaches some limit or until it comes back into control.

Figure 1:
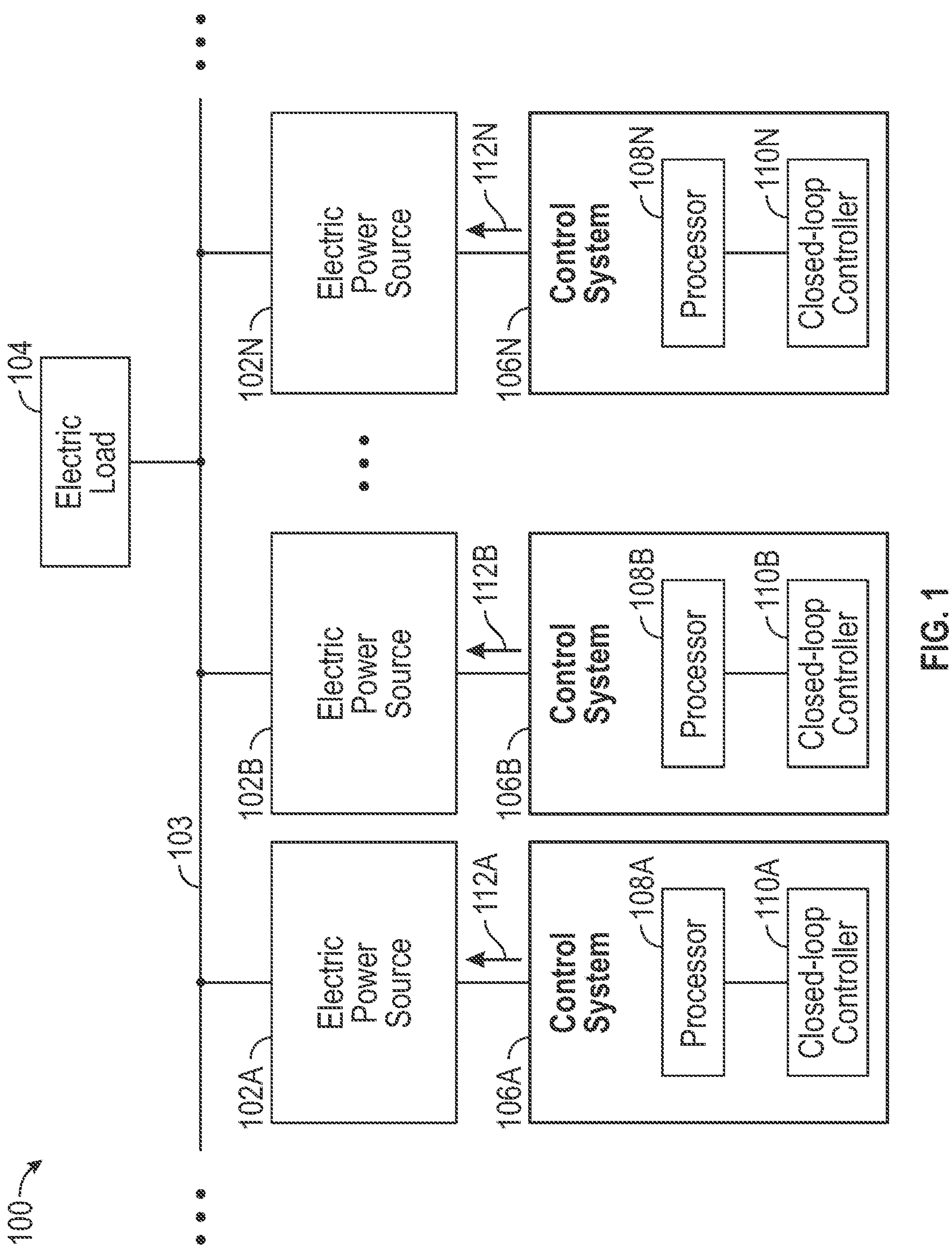
FIG. 1 is a diagram of an example of a system that can implement various techniques of this disclosure.

FIG. 1 is a diagram of an example of a system 100 that can implement various techniques of this disclosure. The system 100 includes electric power sources 102A-102N coupled in parallel with one another and coupled to an electrical bus 103. Examples of the electric power sources include power generator sets or gensets, utility sources, or other electric sources. The electric power sources 102A-102N are configured to share one or more electric loads 104.

Each electric power source can be coupled to a corresponding control system. For example, the electric power source 102A is coupled to the control system 106A. The control system 106A can include a processor 108A and a closed-loop controller 110A. A closed-loop controller drives an output that affects a measurement that is fed back to the system as an input that then generates an output, thereby forming a loop.

The closed-loop controller 110A can include a time-independent component and a time-dependent component. In some examples, the time-independent component includes a proportional component, and the time-dependent component includes an integral component. In some examples, the closed-loop controller 110A can further include rate-of-change component, such as a derivative component. In some examples, the closed-loop controller 110A includes a proportional-integral (PI) controller. In some examples, the closed-loop controller 110A includes a proportional-integral-derivative (PID) controller.

The control systems 106B-106N can be similar to the control system 106A. The electric power source 102B can be coupled to a control system 106B and the electric power source 102N can be coupled to a control system 106N As described in more detail below, the control system, such as the control system 106A can adjust, based on a control signal, a characteristic, e.g., speed or voltage, of the electric power source to which it is coupled, such as the electric power source 102A. In addition, the control system can utilize a window around a setpoint, such as a percentage of an output range, and count how many times a measurement moves from beyond one boundary of the window (e.g., an upper limit) to beyond the other boundary of the window (e.g., a lower limit), which is a characteristic of oscillation. In response, a control system can adjust a time-independent component of a closed-loop controller to weaken the time-independent component to try and reduce the oscillation. The control system can continue to monitor and weaken the time-independent component until it reaches some limit or until it comes back into control.

Figure 2:
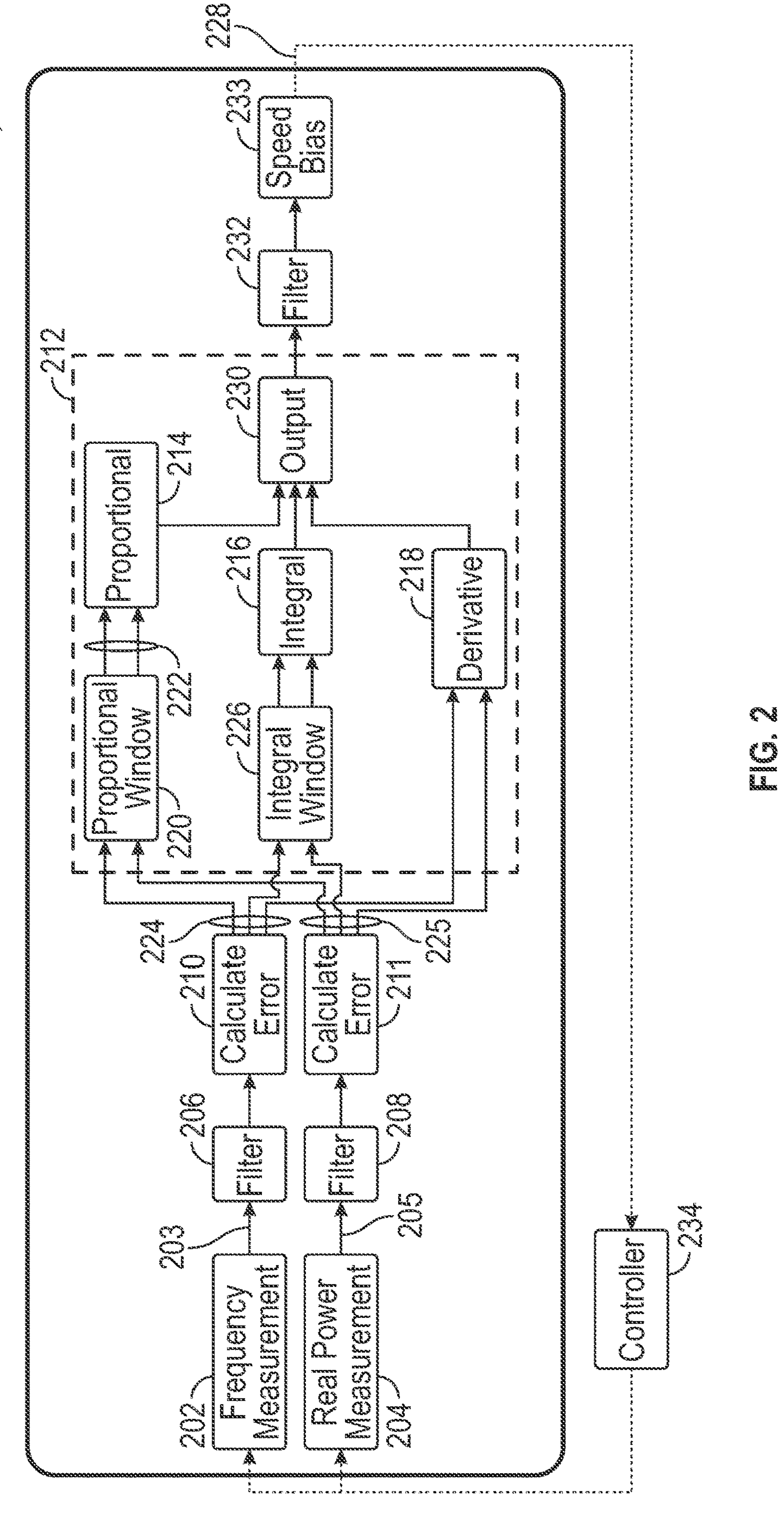
FIG. 2 is a block diagram of an example of a load sharing control scheme in accordance with this disclosure.

FIG. 2 is a block diagram of an example of a load sharing control scheme in accordance with this disclosure. The load sharing control scheme 200 of FIG. 2 is a speed control scheme that can be implemented by a control system, such as the control system 106A of FIG. 1. For example, to change the frequency of an electric power source, such as a genset, the speed of the genset can be changed, which causes the genset to push or pull additional load from other electric power sources on the electrical bus. In general, the speed control scheme is a closed-loop scheme that receives electric power source frequency and electric power source real power as inputs and generates a speed bias signal as an output. The speed bias signal affects both frequency and real power.

A processor, such as the processor 108A of FIG. 1 can receive a representation of a frequency measurement 202 and a representation of a real power measurement 204. For example, various sensors can perform measurements to determine a frequency and how much real power the electric power source is producing.

A processor, such as the processor 108A of FIG. 1, can implement a filter 206 and a filter 208. The filter 206 can receive the representation of the frequency measurement 202. Similarly, the filter 208 can receive the representation of the real power measurement 204. The filters 206, 208 can mitigate noise from the measurement readings. In some examples, the filters 206, 208 can include low pass filters. In other examples, the filters 206, 208 can include an Exponential Weighted Moving Average (EWMA) filters, which will allow dampening of any high-frequency changes to avoid over-driving the control loop.

Exponential Weighted Moving Average (EWMA) is a type of moving average function. A moving average function produces an average value from a set of input values over some number of periods. EWMA modifies the average by applying an exponential weight that approaches zero as samples increase in age. EWMA uses Equation 1 below:

$$\text{output}_t = \alpha \cdot \text{input} + (1 - \alpha) \cdot \text{output}_{t-1} \qquad \text{Equation 1}$$

EWMA has a single term (alpha) that determines how quickly the exponential weight approaches zero over time. Alpha is a real value between 0 and 1, and as alpha approaches 1, the exponential weight factor decays more quickly and dampens the effect that past samples have on the average. An alpha of 0 pegs the average to 0, while an alpha of 1 causes the output to precisely follow the latest sample. EWMA tends to affect higher frequency changes more than slower-moving lower frequency changes, and this difference is strengthened as lower alpha values are used.

Because the exponential weight factor of EWMA decays to zero over time, the overall effect is like a low pass filter but requires no sample window to be processed and no transformation of samples into the frequency domain. That is, EWMA does not require the preservation of multiple past samples/measurements. In addition, an EWMA filter can be applied to the speed and voltage control outputs to prevent over-driving of the outputs (especially for the speed output due to the inertia of the engine and generator preventing fast changes). Separate EWMA filters can be used for all four measurement values used in the load control algorithm: Frequency, Voltage, Real Power, and Reactive Power.

An error calculator 210 can generate a corresponding error value for the filtered version of the frequency measurement 202.

An error calculator 211 can generate a corresponding error value for the filtered version of the real power measurement 204. The two error values generated by the processor at 210 and 211 can be applied to a closed-loop controller 212, such as the closed-loop controller 110A of FIG. 1. The closed-loop controller 212 can include a time-independent component 214 and a time-dependent component 216. In some examples, the closed-loop controller 212 can further include a rate-of-change component 218.

In some examples, the closed-loop controller 212 can be a proportional-integral (PI) controller where the time-independent component 214 includes a proportional component, and the time-dependent component 216 includes an integral component. In some examples, the closed-loop controller 212 can be a proportional-integral-derivative (PID) controller where the rate-of-change component 218 is a derivative component.

The closed-loop controller 212 can further include a time-independent component window 220, e.g., a proportional component window, where the time-independent component window defines upper and lower limits about a characteristic of the electric power source, such as speed or voltage of the genset. The time-independent component window 220 is configured to generate an output signal 222 representing an adjustment to a time-independent component 214, e.g., a proportional component, of a closed-loop controller 212.

Considering time-independent action, e.g., proportional action, in a closed-loop by itself, in normal circumstances, a change of state to the control loop (whether due to a disturbance in the physical plant or a setpoint change) can produce a sudden spike in error, followed by a proportional response in the opposite direction. This time-independent response, ideally, will be strong enough to reduce the error, but not so strong as to generate error in the opposite direction. Error that flips between positive and negative is sometimes referred to as "ringing" or "porpoising".

To detect a state of oscillation or ringing, the control scheme uses a small window around one or more setpoints (such as 2% of an output range) and counts how many times one or more error values move from outside one side of the window to the other. If both upper and lower limits are exceeded within a certain number of counts or time, the processor determines that there is oscillation occurring and adjusts the time-independent, e.g., proportional action, to weaken it to try and reduce the oscillation.

The processor continues to monitor and weaken a gain of the time-independent component until it hits some limit or until the action comes back into control. For example, for a ringing count of 1, the processor can cut the proportional gain by half. For a ringing count of 2, the processor can cut the proportional gain by one-quarter. For a ringing count of 3, the processor can cut the proportional gain by one-eighth. In some examples, after the time-independent component window 220 is active, the processor can reset it after some period of time, e.g., 500 ms, and reset the gain of the time-independent component returns to a default value.

The processor compares one or more error values 224 and 225 to the time-independent component window 220, where the time-independent component window 220 defines upper and lower limits about a characteristic, e.g., speed, of the electric power source. The time-independent component window 220 is configured to generate one or more output signals 222 representing an adjustment to one or more time-independent components 214 of the closed-loop controller 212.

There is a well-known downside to integration called "integral windup", where the integral action of a control loop has accumulated error in one direction and causes the control action to overshoot the setpoint and move in the opposite direction, at which point the integration has to "unwind". To combat and reduce the chances of this occurring, the control system uses a time-dependent window 226 as a percent of the output range (such as 25%), where, when one or more error values 224 and 225 are outside of the time-dependent window 226, the processor can reduce a gain of one or more time-dependent components, e.g., an integral gain, such as 25% of their original values. This can reduce the amount of time-dependent error, e.g., integration error, accumulated while the time-independent action, e.g., proportional action takes effect. Once the error moves back into the window, the processor can apply the full gains again.

As indicated above, one or more error values 224 and 225 is applied to the closed-loop controller 212. In some examples, the closed-loop controller 212 uses the equations in Equation 3 below:

$$P = -\text{Error} \cdot \text{Gain}_P \qquad \text{Equation 3}$$

$$I_n = I_{n-1} + \text{Gain}_P \cdot - \frac{\text{Error}_n + \text{Error}_{n-1}}{2} \cdot \frac{\Delta t}{t_{Integral}}$$

$$D = \text{Gain}_P \cdot \frac{\text{Error}_n + \text{Error}_{n-1}}{2} \cdot \frac{\Delta t}{t_{Derivative}}$$

The variable $\text{Gain}_P$ refers to proportional gain, $t_{integral}$ refers to an integral time, $t_{Derivative}$ refers to a derivative time, and Δt refers to the execution cycle time of the algorithm. If more than one error value is processed, each error value is coupled with a unique gain, and the resulting terms are summed. A weight factor may also be used to scale each of the error values.

In some examples, a function is used to scale the integral Gain and the derivative Gain (0%-100%) to integral and derivative time (e.g., 30 s-25 ms). An example of the function is shown in Equation 4 below:

$$\text{time} = \frac{-1773.5 \cdot \text{gain} + 180{,}000}{\text{gain} + 6} \qquad \text{Equation 4}$$

The function in Equation 4 is not linear, so most of the gain (e.g., about 22%-about 77%) falls between the most common integral and derivative times (e.g., 5 s-500 ms).

The processor can generate, using the output signals 222 and the closed-loop controller 212 having a time-independent component 214 and the time-dependent component 216, a control signal 228, e.g., a speed bias control signal. If present, the closed-loop controller 212 can also use the rate-of-change component 218 to generate the control signal 228.

In some examples, the processor can filter an output 230 of the closed-loop controller 212 using a filter 232. For example, to avoid overdriving the control, an EWMA filter can be applied to the output 230 before it is translated into a control signal 228, e.g., speed bias signal.

For speed control, the output from the filter 232 can be translated, e.g., scaled, by a speed bias converter 233 into a speed bias offset as revolutions per minute (RPM). For example, a speed bias of 20 with a machine rated at 1500 RPM will cause the generator to target 1520 rpm, where $Speed_{Target}=Speed_{Rated}+Speed_{Bias}$. In addition, the speed bias converter 233 can also be configured to convert the output from the filter 232 to any linear range necessary to drive speed, such as when it is desired to control speed via an analog signal and the digital-analog converter requires a value range of 0-4096 to generate a 4-20 mA signal, the speed bias converter 233 can be reconfigured to output such a range.

A controller 234 can be coupled to the electric power source and configured to receive the control signal 228 and, in response, adjust a characteristic of the electric power source, such as the speed of a genset.

Figure 3:
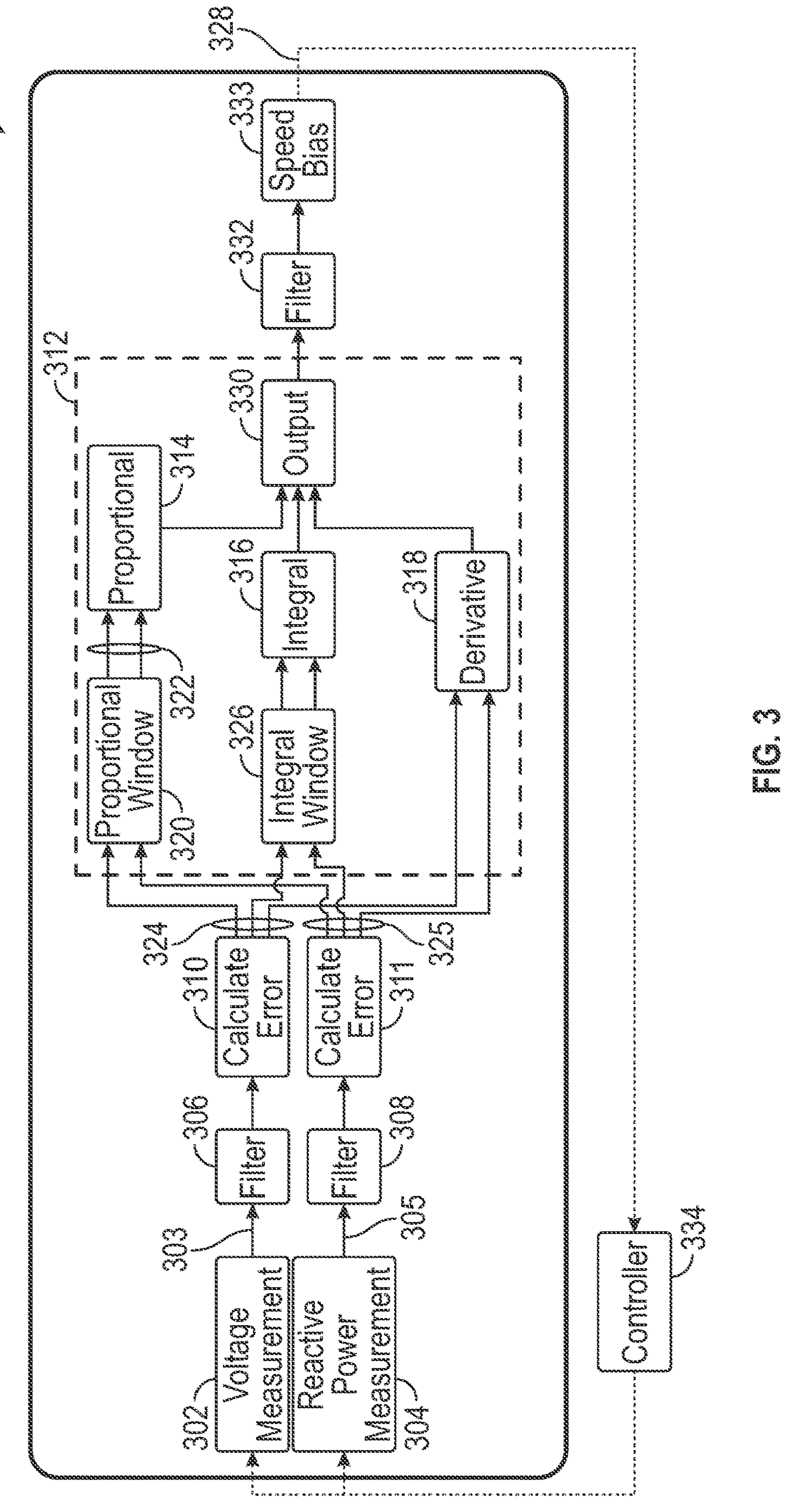
FIG. 3 is a block diagram of another example of a load sharing control scheme in accordance with this disclosure.

FIG. 3 is a block diagram of another example of a load sharing control scheme in accordance with this disclosure. The load sharing control scheme 300 of FIG. 3 is a voltage control scheme that can be implemented by a control system, such as the control system 106A of FIG. 1. In general, the voltage control scheme is a closed-loop scheme that receives a voltage of the electric power source and electric power source reactive power as inputs and generates a voltage bias signal as an output. This voltage bias affects both voltage and reactive power.

A processor, such as the processor 108A of FIG. 1 can receive a representation of a voltage measurement 302 and a representation of a reactive power or power factor measurement 304. For example, various sensors can perform measurements to determine a voltage and how much reactive power the electric power source is producing.

A processor, such as the processor 108A of FIG. 1, can implement a filter 306 and a filter 308. The filter 306 can receive the representation of the voltage measurement 302. Similarly, the filter 308 can receive the representation of the reactive power or power factor measurement 304. The filters 306, 308 can mitigate noise from the measurement readings. In some examples, the filters 306, 308 can include low pass filters.

In other examples, the filters 206, 208 can include an Exponential Weighted Moving Average (EWMA) filters, which will allow dampening of any high-frequency changes to avoid over-driving the control loop. Because each measurement is given a separate filter, the measurements can be tuned so that the reactive measurement will allow faster changes than the voltage measurement. Exponential Weighted Moving Average (EWMA) were described in detail above and, for brevity, will not be described again.

An error calculator 310 can generate a corresponding error value for the filtered version of the voltage measurement 302.

An error calculator 311 can generate a corresponding error value for the filtered version of the reactive power or power factor measurement 304.

The two error values generated by the processor at 310 and 311 can be applied to a closed-loop controller 312, such as the closed-loop controller 110A of FIG. 1. The closed-loop controller 312 can include a time-independent component 314 and a time-dependent component 316. In some examples, the closed-loop controller 312 can further include a rate-of-change component 318.

In some examples, the closed-loop controller 312 can be a proportional-integral (PI) controller where the time-independent component 314 includes a proportional component, and the time-dependent component 316 includes an integral component. In some examples, the closed-loop controller 312 can be a proportional-integral-derivative (PID) controller where the rate-of-change component 318 is a derivative component.

The closed-loop controller 312 can further include a time-independent component window 320, e.g., a proportional component window, where the time-independent component window defines upper and lower limits about a characteristic of the electric power source, such as speed or voltage of the genset. The time-independent component window 320 is configured to generate an output signal 322 representing an adjustment to a time-independent component 314, e.g., a proportional component, of a closed-loop controller 312. The time-independent component window 220, which is similar to the time-independent component window 320, was described in detail above.

The processor compares one or more error values 324 and 325 to the time-independent component window 320, where the time-independent component window 320 defines upper and lower limits about a characteristic, e.g., voltage, of the electric power source. The time-independent component window 320 is configured to generate one or more output signals 322 representing an adjustment to a time-independent component 314 of the closed-loop controller 312.

The control system uses a time-dependent window 326 as a percent of the output range (such as 25%), where, when one or more error values 324 and 325 are outside of the time-dependent window 326, the processor can reduce a gain of one or more of the time-dependent components, e.g., an integral gain, such as 25% of their original values. This can reduce the amount of time-dependent error, e.g., integration error, accumulated while the time-independent action, e.g., proportional action takes effect. Once the error moves back into the window, the processor can apply the full gain again.

As indicated above, one or more error values 324 and 325 is applied to the closed-loop controller 312. In some examples, the closed-loop controller 212 uses the equations in Equation 3 above.

In some examples, a function is used to scale the integral Gain and the derivative Gain (0%-100%) to integral and derivative time (e.g., 30 s-25 ms). An example of the function is shown in Equation 4 above.

The processor can generate, using the output signals 322 and the closed-loop controller 312 having the time-independent component 314 and the time-dependent component 316, a control signal 328, e.g., a voltage bias control signal. If present, the closed-loop controller 312 can also use the rate-of-change component 318 to generate the control signal 328.

In some examples, the processor can filter an output 330 of the closed-loop controller 312 using a filter 332. For example, to avoid overdriving the control, an EWMA filter can be applied to the output 330 before it is translated into a control signal 328, e.g., voltage bias signal.

For voltage control, the output from the EWMA filter can be translated into a voltage bias offset by a voltage bias converter 333 as a percentage of rated voltage. For example, a voltage bias of −1.4 with a machine rated at 480V will cause the generator to target 473.28 V. In addition, the voltage bias converter 333 can also be configured to convert the voltage bias to any linear range necessary to drive speed, such as when it is desired to control speed via an analog signal and the digital-analog converter requires a value range of 0-4096 to generate a 4-20 mA signal, the voltage bias converter can be reconfigured to output such a range.

A controller 334 can be coupled to the electric power source and configured to receive the control signal 328 and, in response, adjust a characteristic of the electric power source, such as the voltage of a genset.

It should be noted that the techniques of FIGS. 2 and 3 can be used together to control both the speed and the voltage of an electric power source.

Figure 4:
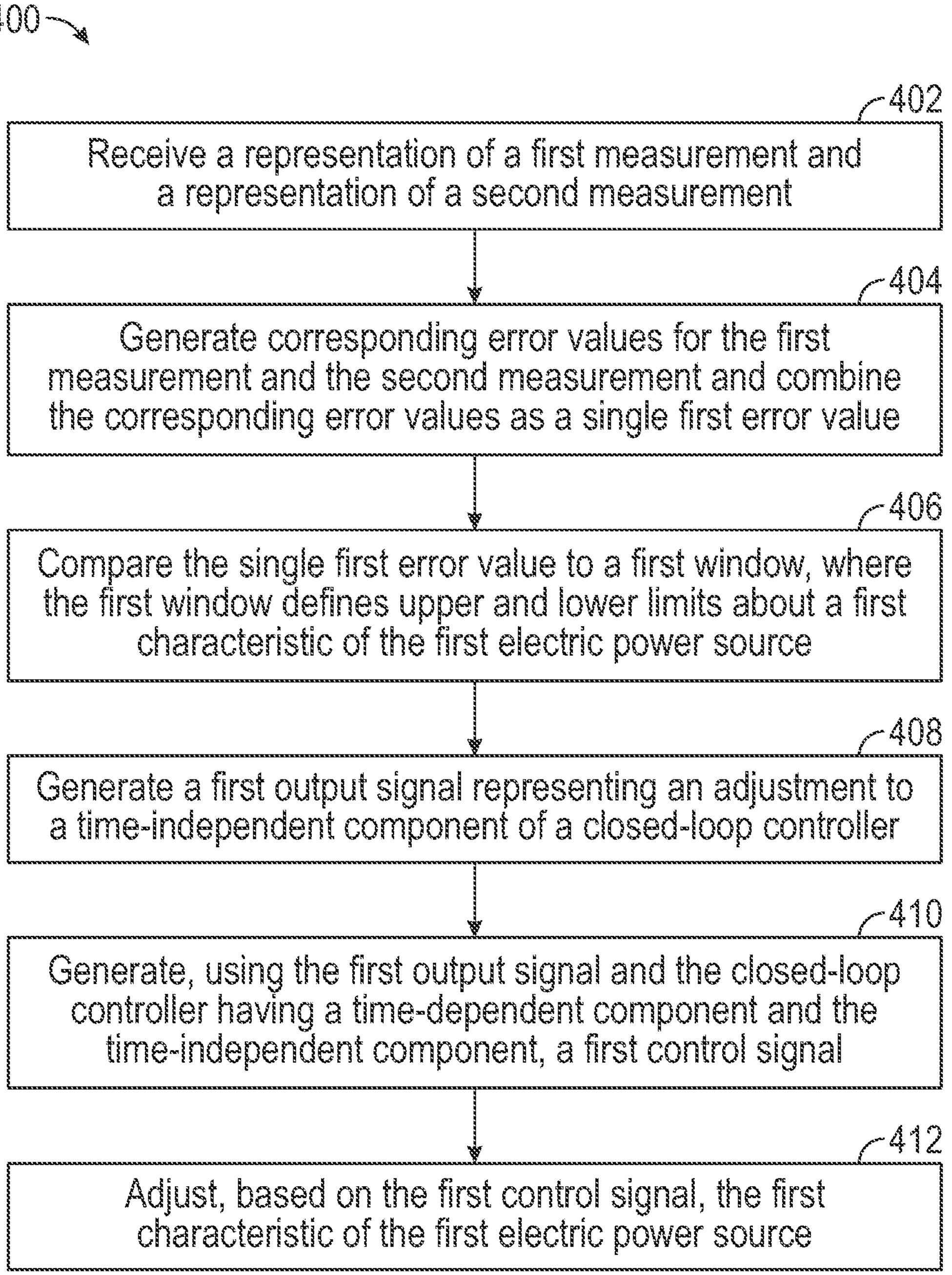
FIG. 4 is a flow diagram of an example of a computer-implemented method of monitoring and controlling a first electric power source coupled in parallel with a second electric power source, where the first electric power source and the second electric power source are configured to share a load.

FIG. 4 is a flow diagram of an example of a computer-implemented method 400 of monitoring and controlling a first electric power source coupled in parallel with a second electric power source, where the first electric power source and the second electric power source are configured to share a load. At step 402, the method 400 includes receiving a representation of a first measurement and a representation of a second measurement. For example, a processor can receive representations of a frequency measurement 202 and a real power measurement 204, such as in FIG. 2, and/or representations of a voltage measurement 302 and a reactive power or power factor measurement 304, such as in FIG. 3.

At step 404, the method 400 includes generating corresponding error values for the first measurement and the second measurement and combining the corresponding error values as a single first error value. For example, the processor can generate corresponding error values 203, 205 for the frequency measurement 202 and the real power measurement 204 and combine the corresponding error values as a single first error value at 210, as in FIG. 2. Similarly, the processor can generate corresponding error values 303, 305 for the voltage measurement 302 and the reactive power or power factor measurement 304 and combine the corresponding error values as a single first error value at 310, as in FIG. 3.

At step 406, the method 400 includes comparing the single first error value to a first window, where the first window defines upper and lower limits about a first characteristic of the first electric power source. For example, the processor can compare the single error value 224 of FIG. 2 to a time-independent component window 220, such as in FIG. 2. Similarly, the processor can compare the single error value 324 of FIG. 3 to a time-independent component window 320, such as in FIG. 3.

At step 408, the method 400 includes generating a first output signal representing an adjustment to a time-independent component of a closed-loop controller. For example, the processor can generate an output signal 222 representing an adjustment to the time-independent component 214 of the closed-loop controller 212. Similarly, the processor can generate an output signal 322 representing an adjustment to the time-independent component 314 of the closed-loop controller 312.

At step 410, the method 400 includes generating, using the first output signal and the closed-loop controller having a time-dependent component and the time-independent component, a first control signal. For example, the processor can generate, using the output signal 222 and the closed-loop controller 212, a control signal 228, as in FIG. 2. Similarly, the processor can generate, using the output signal 322 and the closed-loop controller 312, a control signal 328, as in FIG. 3.

At step 412, the method 400 includes adjusting, based on the first control signal, the first characteristic of the first electric power source. For example, the controller 234 of FIG. 2 can receive the control signal 228 and adjust a speed of the electric power source. Similarly, the controller 334 of FIG. 3 can receive the control signal 328 and adjust a voltage of the electric power source.

INDUSTRIAL APPLICABILITY

A control algorithm used to govern electrical power sources, e.g., gensets, electric utility sources, and the like, so that one or more electrical power sources of varying size and type may operate in parallel to power a wide variety of changing loads with or without the presence of a stable power source. The control algorithm controls the performance of the load sharing between multiple electric power sources, e.g., gensets. Changes in the real and reactive loads of a system can also influence voltage and frequency control of the same system, along with issues due to integrator wind-up and proportional oscillation.

This disclosure describes techniques that not only weigh frequency/voltage and real/reactive load sharing separately, but also utilize a window around a setpoint, such as a percentage of an output range, and determine whether there is oscillation. In response, a control system can adjust a time-independent component of a closed-loop controller to weaken the time-independent component to try and reduce the oscillation. The control system can continue to monitor and weaken the time-independent component until it reaches some limit or until it comes back into control.

Unless explicitly excluded, the use of the singular to describe a component, structure, or operation does not exclude the use of plural such components, structures, or operations or their equivalents. The use of the terms “a” and “an” and “the” and “at least one” or the term “one or more,” and similar referents in the context of describing the invention (especially in the context of the following claims) are to be construed to cover both the singular and the plural, unless otherwise indicated herein or clearly contradicted by context. The use of the term “at least one” followed by a list of one or more items (for example, “at least one of A and B” or one or more of A and B") is to be construed to mean one item selected from the listed items (A or B) or any combination of two or more of the listed items (A and B; A, A and B; A, B and B), unless otherwise indicated herein or clearly contradicted by context. Similarly, as used herein, the word “or” refers to any possible permutation of a set of items. For example, the phrase “A, B, or C” refers to at least one of A, B, C, or any combination thereof, such as any of: A; B; C; A and B; A and C; B and C; A, B, and C; or multiple of any item such as A and A; B, B, and C; A, A, B, C, and C; etc.

The above detailed description is intended to be illustrative, and not restrictive. The scope of the disclosure should, therefore, be determined with references to the appended claims, along with the full scope of equivalents to which such claims are entitled.

What is claimed is:

1. A control system to monitor and control a first electric power source coupled in parallel with a second electric power source, wherein the first electric power source and the second electric power source are configured to share a load, the control system comprising:

a processor configured to:

receive a representation of a first measurement and a representation of a second measurement, wherein the first measurement and the second measurement are measurements of different characteristics of the first electric power source;

apply a first filter to the representation of the first measurement and a second filter to the representation of the second measurement, wherein at least one of the first filter and the second filter includes an exponential weighted moving average filter;

generate corresponding error values for the filtered first measurement and the filtered second measurement and combine the corresponding error values as a single first error value;

compare the single first error value to a first window, wherein the first window defines upper and lower limits about a first characteristic of the first electric power source around a setpoint, and wherein the first window is configured to generate a first output signal representing an adjustment to a time-independent component of a closed-loop controller; and generate, using the first output signal and the closed-loop controller having a time-dependent component and the time-independent component, a first control signal; and a controller coupled to the first electric power source and configured to receive the first control signal and, in response, adjust the first characteristic of the first electric power source.

2. The control system of claim 1, wherein the first measurement includes a frequency measurement, the second measurement includes a real power measurement, and the first characteristic is a speed of the first electric power source.

3. The control system of claim 1, wherein the first measurement includes a voltage measurement, the second measurement includes a reactive power measurement, and the first characteristic is a voltage of the first electric power source.

4. The control system of claim 1, wherein the processor is further configured to:

receive a representation of a third measurement and a representation of a fourth measurement;

generate corresponding error values for the third measurement and the fourth measurement and combine the corresponding error values as a single second error value; and generate, using the single second error value and the closed-loop controller, a second control signal, wherein the controller is further configured to receive the second control signal and, in response, adjust a second characteristic of the first electric power source.

5. The control system of claim 4, wherein the first measurement includes a frequency measurement, the second measurement includes a real power measurement, the third measurement includes a voltage measurement, and the fourth measurement includes at least one of a reactive power measurement or a power factor measurement.

6. The control system of claim 1, wherein the processor is further configured to:

compare the single first error value to a second window, wherein the second window defines upper and lower limits about a second characteristic of the first electric power source, wherein the second window is configured to generate a second output signal representing an adjustment to the time-dependent component of the closed-loop controller.

7. The control system of claim 1, wherein the time-independent component is a proportional component, wherein the time-dependent component is an integral component.

8. The control system of claim 1, wherein the closed-loop controller includes a proportional-integral-derivative (PID) controller.

9. A computer-implemented method of monitoring and controlling a first electric power source coupled in parallel with a second electric power source, wherein the first electric power source and the second electric power source are configured to share a load, the computer-implemented method comprising:

receiving a representation of a first measurement and a representation of a second measurement, wherein the first measurement and the second measurement are measurements of different characteristics of the first electric power source;

applying a first filter to the representation of the first measurement and a second filter to the representation of the second measurement, wherein at least one of the first filter and the second filter includes an exponential weighted moving average filter;

generating corresponding error values for the filtered first measurement and the filtered second measurement and combining the corresponding error values as a single first error value;

comparing the single first error value to a first window, wherein the first window defines upper and lower limits about a first characteristic of the first electric power source around a setpoint;

generating a first output signal representing an adjustment to a time-independent component of a closed-loop controller;

generating, using the first output signal and the closed-loop controller having a time-dependent component and the time-independent component, a first control signal; and adjusting, based on the first control signal, the first characteristic of the first electric power source.

10. The computer-implemented method of claim 9, wherein the first measurement includes a frequency measurement, the second measurement includes a real power measurement, and the first characteristic is a speed of the first electric power source.

11. The computer-implemented method of claim 9, wherein the first measurement includes a voltage measurement, the second measurement includes a reactive power measurement, and the first characteristic is a voltage of the first electric power source.

12. The computer-implemented method of claim 9, further comprising:

receiving a representation of a third measurement and a representation of a fourth measurement;

generating corresponding error values for the third measurement and the fourth measurement and combine the corresponding error values as a single second error value;

generating, using the single second error value and the closed-loop controller, a second control signal; and adjusting, based on the second control signal, a second characteristic of the first electric power source.

13. The computer-implemented method of claim 12, wherein the first measurement includes a frequency measurement, the second measurement includes a real power measurement, the third measurement includes a voltage measurement, and the fourth measurement includes at least one of a reactive power measurement or a power factor measurement.

14. The computer-implemented method of claim 9, further comprising:

comparing the single first error value to a second window, wherein the second window defines upper and lower limits about a second characteristic of the first electric power source; and generating a second output signal representing an adjustment to the time-dependent component of the closed-loop controller.

15. The computer-implemented method of claim 9, wherein the time-independent component is a proportional component, wherein the time-dependent component is an integral component.

16. The computer-implemented method of claim 9, wherein the closed-loop controller includes a proportional-integral-derivative (PID) controller.

17. A control system to monitor and control a first electric power source coupled in parallel with a second electric power source, wherein the first electric power source and the second electric power source are configured to share a load, the control system comprising:

a processor configured to:

receive a representation of a first measurement and a representation of a second measurement, wherein the first measurement and the second measurement are measurements of different characteristics of the first electric power source;

apply a first filter to the representation of the first measurement and a second filter to the representation of the second measurement, wherein at least one of the first filter and the second filter includes an exponential weighted moving average filter;

generate corresponding error values for the filtered first measurement and the filtered second measurement and combine the corresponding error values as a single first error value;

compare the single first error value to a proportional component window, wherein the proportional component window defines upper and lower limits about a first characteristic of the first electric power source around a setpoint, and wherein the proportional component window is configured to generate a first output signal representing an adjustment to a proportional component of a closed-loop controller; and generate, using the first output signal and a controller having the proportional component and an integral component, a first control signal; and a controller coupled to the first electric power source and configured to receive the first control signal and, in response, adjust the first characteristic of the first electric power source.

18. The control system of claim 17, wherein the first measurement includes a frequency measurement, the second measurement includes a real power measurement, and the first characteristic is a speed of the first electric power source.

* * * * *